United States Patent [19]
Shrivastava

[11] Patent Number: 5,518,942
[45] Date of Patent: May 21, 1996

[54] METHOD OF MAKING FLASH EPROM CELL HAVING IMPROVED ERASE CHARACTERISTICS BY USING A TILT ANGLE IMPLANT

[75] Inventor: Ritu Shrivastava, Fremont, Calif.

[73] Assignee: Alliance Semiconductor Corporation, San Jose, Calif.

[21] Appl. No.: 394,542

[22] Filed: Feb. 22, 1995

[51] Int. Cl.$^6$ .............................................. H01L 21/8247
[52] U.S. Cl. .................. 437/43; 437/30; 437/35
[58] Field of Search ................... 437/30, 35, 43, 437/44, 157

[56] References Cited

U.S. PATENT DOCUMENTS

| | | | |
|---|---|---|---|
| 4,894,802 | 1/1990 | Hsia et al. | 365/185 |
| 5,073,514 | 12/1991 | Ito et al. | 437/35 |
| 5,077,691 | 12/1991 | Haddad et al. | 365/218 |
| 5,190,887 | 3/1993 | Tang et al. | 437/43 |
| 5,267,194 | 11/1993 | Jang | 365/185 |
| 5,316,961 | 5/1994 | Okazawa | 437/43 |
| 5,366,915 | 11/1994 | Kodama | 437/43 |

*Primary Examiner*—Chandra Chaudhari
*Attorney, Agent, or Firm*—Bradley T. Sako

[57] ABSTRACT

A method of manufacturing a flash EPROM cell is disclosed. A flash EPROM gate stack (114) is formed on p-type silicon substrate (100) having tunnel oxide (102) thereon. The gate stack (114) includes a polysilicon floating gate (106), an intergate dielectric (108), and a control gate (116). The substrate (100) includes a source region (120), a channel (122) and a drain region (118) therebetween. A source implant mask (124) is created that covers at least the drain region (118) and leaves the source region (120) exposed. Large angle ion implantation is used to implant a source dopant into the source region (120) below the floating gate (106) of the gate stack (114). The source implant mask (124) is stripped and the source and drain regions (118 and 120) are doped with a source/drain implant by ion implantation at an implant angle of approximately zero degrees (~0°).

13 Claims, 5 Drawing Sheets

METHOD OF MAKING FLASH EPROM CELL HAVING IMPROVED ERASE CHARACTERISTICS BY USING A TILT ANGLE IMPLANT

TECHNICAL FIELD

The present invention relates generally to flash EPROM circuits, and more particularly to flash EPROM cells with improved erase times and fabrication methods thereof.

BACKGROUND OF THE INVENTION

Among the types of electrically alterable programmable memories in the prior art, there are "conventional" EEPROMs and "flash" EPROMs (which are also often referred to as flash EEPROMs). Conventional EEPROMs, because they utilize Fowler-Nordheim tunneling to program and erase, typically have a two transistor cell design. The first transistor has a stacked control gate and floating gate, and is programmed to a negative threshold voltage. The second transistor, usually called a select transistor, operates to access the first transistor.

Flash EPROMs provide an advantage over conventional EEPROMs in cell size. Unlike conventional EEPROMs, flash EPROMs are programmed using hot electron injection, and erased using Fowler-Nordheim tunneling. This results in a positive programmed threshold value for the stacked gate structure, eliminating the need for a select transistor. Thus, flash EEPROMs are typically manufactured with cell designs having only one transistor, providing for smaller cell sizes and allowing for denser memories.

Figure 1:
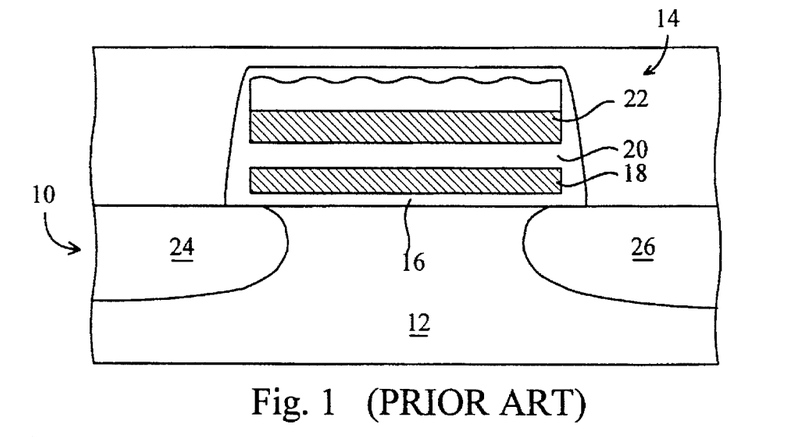
FIG. 1 is a side cross sectional view of a single transistor flash EPROM cell of the prior art.

A one transistor flash EPROM cell is set forth in cross section in FIG. 1. As shown in the figure, the cell 10 includes a silicon substrate 12 and a gate "stack" 14 having a layer of tunnel oxide 16, a floating gate 18 (typically polysilicon), an intergate dielectric 20, and a control gate 22 (also typically polysilicon). A source region 24 and a drain region 26 are formed within the substrate 12 on opposing sides of the gate stack 14, with both regions having portions extending underneath the floating gate 18. While conventional EEPROMs may be selectively erased in a byte-by-byte fashion, flash EPROMs cells are typically arranged with common drain diffusions and/or connections, requiring simultaneous erasing of all of the cells, or blocks of cells (often called pages).

In a typical flash EPROM cell fabrication process, following the formation of the gate stack, the source and drain regions are formed by ion implanting a dopant into the substrate, with the gate stack functioning as a mask. Following ion implantation, the wafer is typically heat treated, activating the implanted dopant, repairing lattice damage, and allowing the dopant to diffuse outward. Because ion implantation of the source region 24 is performed at an implantation angle of zero (or close to zero, depending on lattice structure) the dopant concentration decreases as the source region 24 extends underneath the gate stack 14.

The critical operating parameters of any flash EPROM cell are its program speed, erase speed, and read current. As mentioned previously, a programmed cell stores a number of electrons that have been injected via hot electron injection. During the erase operation of flash cell, a positive potential is applied between the source and the control gate, and electrons tunnel through the tunnel oxide to the source. A number of prior art teachings have addressed optimization of the program and/or erase operation of flash EPROMs.

For example, because a relatively large voltage (~12 volts) is introduced during erase operations, it is well-known to use a double-diffused source to prevent reverse breakdown of the source-substrate junction during programming.

U.S. Pat. No. 5,077,691 issued to Haddad et al., on Dec. 31, 1991, provides a flash EPROM design and erasing scheme that eliminates the need for a double diffused source by applying a relatively high negative voltage to the control gate and a relatively low positive voltage to the source (while placing the substrate at 0 volts).

U.S. Pat. No. 5,190,887 issued to Tang et at., on Mar. 2, 1993, discloses a method of fabricating a flash EPROM cell wherein large angle ion implantation is used to implant a significant number of ions into the drain region and the portion of the channel near the drain region. The large angle implanted ions are of the same conductivity type as the channel, and increase the channel doping adjacent to the drain regions. This allows for increased programming performance, and increased source and drain doping (of a conductivity type opposite to that of the substrate) for greater source-substrate breakdown voltages. While providing an improved channel concentration arrangement, Tang et al. does not provide a way to improve erase performance, except by increasing the source-drain implant.

U.S. Pat. No. 5,267,194 issued to Wen-Yueh Jang, on Nov. 11, 1993 discloses an EEPROM cell that includes a control gate having a reentrant profile. An adjacent floating gate is disposed between the control gate and the source, and include a protrusion that extends into the reentrant portion of the control gate. The reentrant profile and corresponding floating gate protrusion enhance erase operation. While providing for increased erase efficiency, the cell as taught by Jang is not a stacked structure, and requires a larger cell size.

U.S. Pat. No. 4,894,802 issued to Hsia et al., on Jan. 16, 1990 discloses a flash EPROM cell having a tunnel oxide window of decreased thickness between the drain and the floating gate for increased programming efficiency and improved program/erase endurance. As with the teachings of Jang, Hsia et al. presents a cell of relatively large size.

SUMMARY OF THE INVENTION

Accordingly, it is an object of the present invention to provide a flash EPROM cell having faster erase time.

It is another object of the present invention to provide a method of manufacturing a flash EPROM cell having a faster erase time.

It is yet another object of the present invention to provide a flash EPROM cell of a single transistor design, that has an improved source concentration profile.

According to the invention, large angle ion implantation is utilized to implant a source dopant in the source region so that a substantial number of source dopants are implanted below the floating gate. Following heat treatment, the source dopant diffuses outward, including toward the substrate surface, to provide an improved concentration profile at the interface of the floating gate and the source diffusion. The increased concentration profile results in larger erase currents, and correspondingly, faster erase times.

According to an aspect of the invention, large angle ion implantation of the source is used in conjunction with conventional doping techniques to modulate the erase time of flash EPROM cells.

In a further aspect of the invention, large angle ion implantation is used in conjunction with zero, or near-zero angle ion implantation to form a source region.

An advantage of the present invention is that it provides a method of creating a flash EPROM cell having a faster erase time without increasing the size of the cell.

Other objects, features and advantages of the invention will become apparent in light of the following description thereof.

DETAILED DESCRIPTION OF THE INVENTION

According to the present invention the source region of a single transistor cell is doped using large angle ion implantation so that a number of source dopants are implanted below the floating gate of the cell. The dopants diffuse during subsequent heat treatments to provide an increased source concentration profile below the floating gate.

FIGS. 2a–2i set forth a partial cross sectional view of a wafer to illustrate the steps required to manufacture a flash EPROM device according to the present invention. One skilled in the art would recognize that while FIGS. 2a–2i set forth only a single cell, peripheral circuitry and an array of like cells are simultaneously fabricated in the processing steps set forth.

Figure 2A:
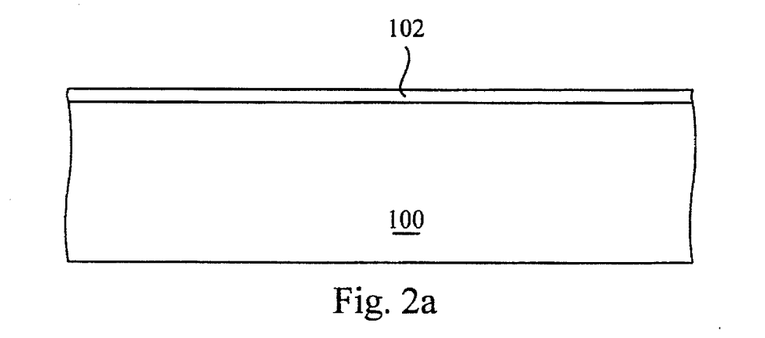
FIGS. 2a–2i are cross sectional views illustrating the fabrication of a flash EPROM according to the present invention.

Referring now to FIG. 2a, a semiconductor substrate 100 is set forth having a layer of tunnel oxide 102 grown thereon. In one embodiment of the present invention the substrate 100 is p-type silicon, and the tunnel oxide 102 is silicon dioxide ($SiO_2$) that is thermally grown to a thickness of 80–110 Å. While $SiO_2$ is set forth as the tunnel oxide, it is understood that the use of alternate materials to form a tunnel dielectric are known in the art, and that the selection of $SiO_2$ should not be read as limiting.

Figure 2B:
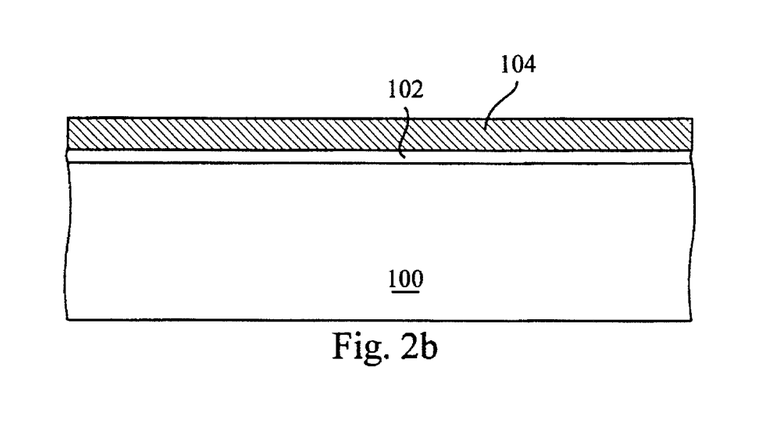

Following the creation of the tunnel oxide 102, a first layer of polysilicon (POLY1) 104 is deposited over the tunnel oxide 102, as is set forth in FIG. 2b. The POLY1 104 is deposited using well-known low pressure, chemical vapor deposition (LPCVD) techniques. In the preferred embodiment, POLY1 104 has a thickness of 1000–1500 Å. The conductivity of the POLY1 104 layer is increased by doping. The preferred method of doping includes a combination of ion implantation and furnace (or in situ) doping. One skilled in the art would recognize either doping methods may be implemented individually according to well-known process integration methods.

Figure 2C:
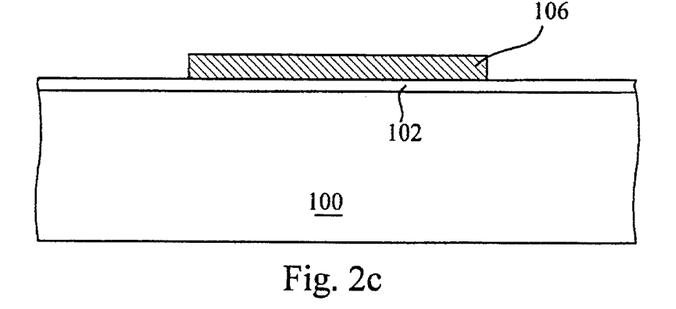

As set forth in FIG. 2c, the POLY1 104 is patterned, resulting in the formation of a floating gate 106. The floating gate 106 is patterned from the POLY1 using well-known photolithographic techniques to generate an etch mask of photoresist. In the embodiment of FIG. 2c, an anisotropic etch is applied to create the floating gate using reactive ion etching (RIE). One skilled in the art would recognize that other polysilicon etching techniques could also be employed. Following the creation of the floating gate 106, the etch mask is stripped. Resist stripping techniques are well-known in the art, and so for that reason, will not be discussed in any further detail herein.

Figure 2D:
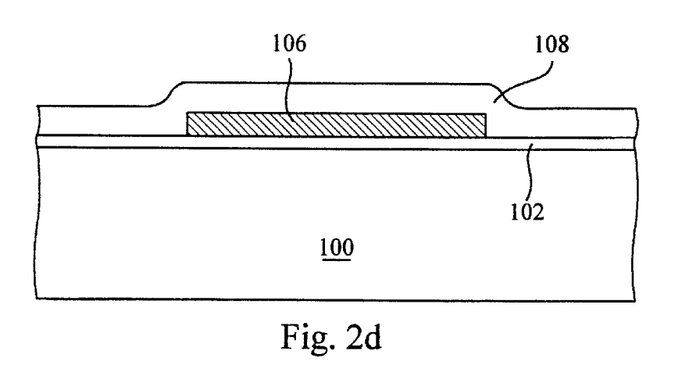

Referring now to FIG. 2d, it is shown that following the creation of the floating gate 106, an interpoly dielectric 108 is created over the floating gate 106. In the embodiment set forth in FIGS. 2a–2i, the interpoly dielectric 108 is a composite of $SiO_2$, silicon nitride, and another layer of $SiO_2$ (ONO), having a total thickness of 100–200 Å. The ONO layer is created according to well-known oxidation and chemical vapor deposition techniques, and therefore, will not be discussed in detail herein. It is understood that the a particular interpoly dielectric 108 structure (ONO) set forth herein should not be read a limiting. One skilled in the art could arrive at other dielectric compositions of differing materials and dimensions according to well-know process integration techniques.

Figure 2E:
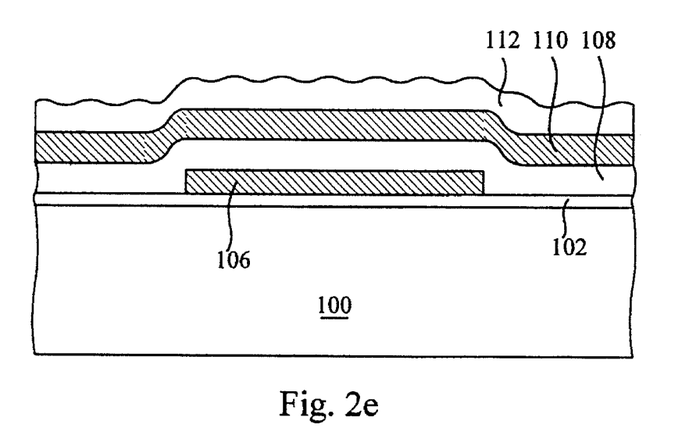

The process set forth in FIGS. 2a–2i continues with a second layer of polysilicon (POLY2) 110 being deposited over the intergate dielectric 108, as illustrated in FIG. 2e. The POLY2 110 is deposited using LPCVD techniques and the resistance of the POLY2 110 is decreased by doping the POLY2 110 either by ion implantation, in situ techniques or a combination thereof. Following the initial POLY2 110 deposition, as set forth in FIG. 2e, a top layer of silicide 112 is deposited on the POLY2 110. In the embodiment illustrated in FIG. 2e, tungsten silicide 112 is deposited over the POLY2 110. The resulting POLY2-silicide layer includes ~1500 Å of POLY2 110, and 1000–1500 Å of tungsten silicide 112.

Figure 2F:
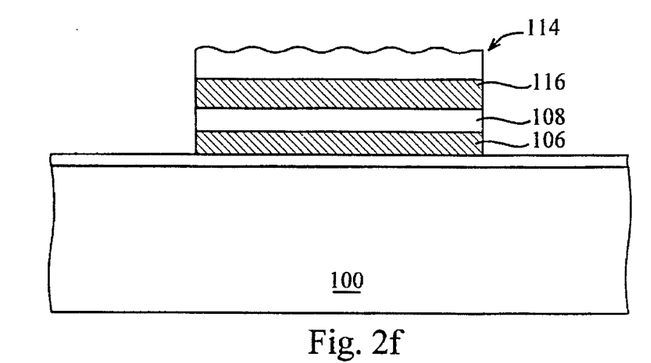

A second patterning step follows the POLY2 110 deposition and silicide 112 step. Using standard photolithographic techniques a gate stack etch mask is used, and an anisotropic etch applied, resulting in a gate "stack" structure 114 as shown in FIG. 2f. The gate stack 114 includes the floating gate 106, the intergate dielectric 108, and a control gate 116 formed from the POLY2-silicide layer.

Figure 2G:
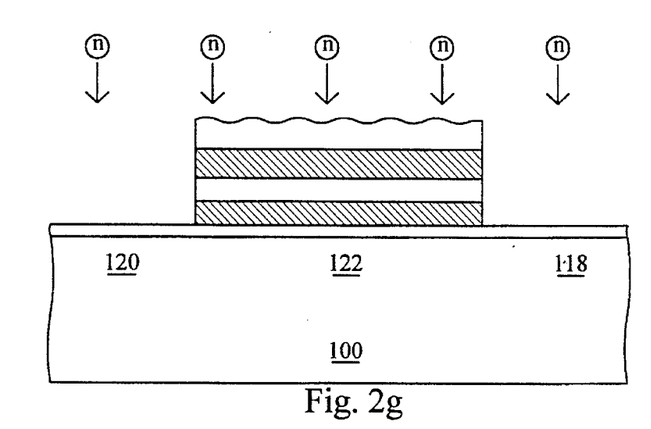

Referring now to FIG. 2g, a source/drain ion implantation step is fancifully illustrated. The direction of implantation represented by a series of arrows. The gate stack 114 functions as a mask for the substrate 100, blocking any ions from entering the portion of the substrate 100 directly below the gate stack 114. In the embodiment set forth in FIGS. 2a–2i, the source/drain implant is an n+ implant of arsenic (As +75). As shown in FIG. 2g, the angle of implantation is approximately zero degrees (~0°). The source/drain dopant is implanted into a drain region 118, and a source region 120 of the substrate 100. As is well known in the art, the portion of the substrate between the source region 120 and drain region 118 is the channel 122.

Figure 2H:
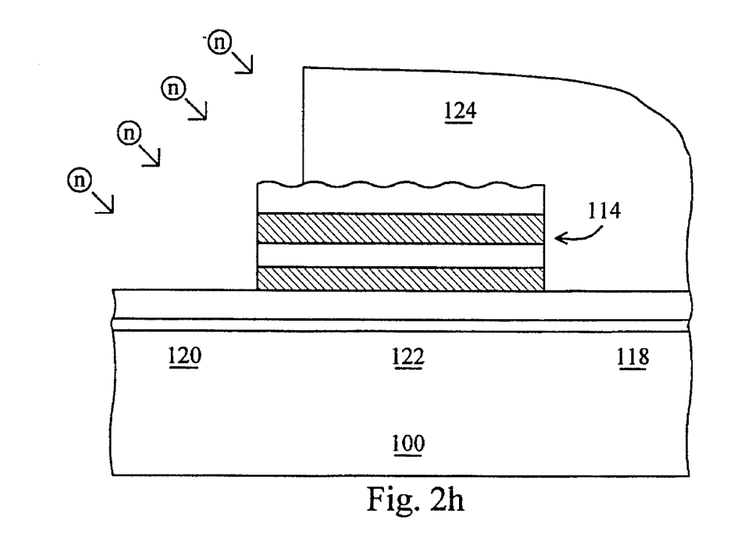

FIG. 2h sets forth a primary aspect of the present invention. Following the first implantation of the source and drain regions (118 and 120) as illustrated in FIG. 2g, a source implant mask 124 is generated as shown in FIG. 2h. The source implant mask 124 covers the drain region 118 while leaving the source region 120 exposed. In the embodiment set forth in FIG. 2h, the source implant mask 124 is composed of photoresist, and is created using well-known photolithographic techniques. After the source implant masking step 124, a second ion implantation is performed. The second ion implantation is a large angle implantation, and is fancifully depicted by the directional arrows in FIG. 2h. The angle of implantation is an acute one with respect to the substrate 100 on the source region 120 side of the gate stack 114. Following the second ion implantation, the source implant mask resist 124 is stripped.

Figure 2I:
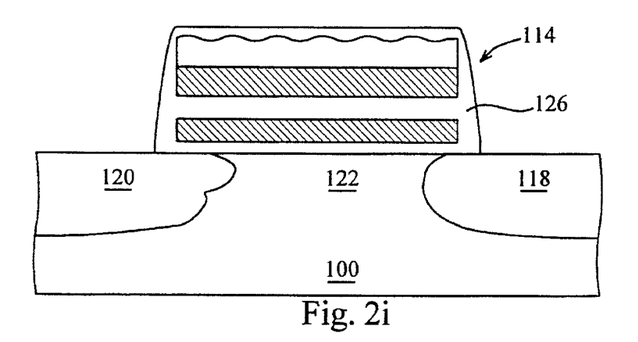

A heat treatment is applied to activate the implanted ions. A cross section representing the doping of the source and drain regions (118 and 120) following the heat treatment is shown in FIG. 2i. As illustrated in the figure, the drain region 118 appears to be of conventional fabrication. The source region 120 illustrates the increased doping concentration that extends beneath the floating gate 106. FIG. 2i also illustrates the formation of oxide sidewalls 126 on gate stack 114 created during the heat treatment step. It is understood the views of FIGS. 2a–2i are illustrative only, having exaggerated dimensions to assist in understanding the process of the present invention. It is also understood that the order of the ion implantation steps set forth in FIGS. 2g and 2h may be reversed.

The process concludes with conventional processing steps including formation of periphery transistors, a dielectric that is deposited over the gate stack, at least a first metallization layer for interconnect, and a passivation layer.

In an alternate embodiment of the present invention the source regions and drain regions are doped separately. This embodiment uses the same initial process steps as shown in FIGS. 2a–2f, but departs once ion implantation is to be performed. The implantation steps of the alternate embodiment are set forth in FIGS. 3a–3e. The alternate embodiment includes the same general structures as those appearing in FIGS. 2a–2i, and to that extent, structures which are identical to those appearing in the embodiment of FIGS. 2a–2i will be referred to by reference numbers incorporating the original reference with the initial digit changed from a "1" to a "3".

Figure 3A:
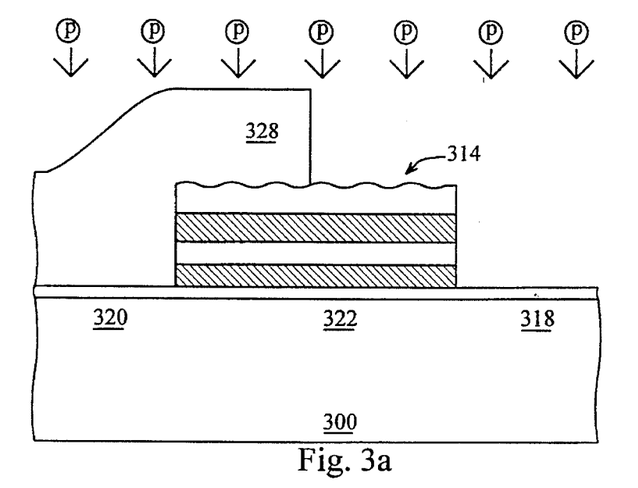
FIGS. 3a–3e are cross sectional views illustrating the fabrication of a flash EPROM cell according to an alternate embodiment of the present invention.

As set forth in FIG. 3a, the alternate embodiment includes a drain implant mask 328, that covers the source region 320 while exposing the drain region 318. Similar to the source implant mask 124 of the embodiment illustrated in FIG. 2h, the drain implant mask 328 is formed from photoresist using standard photolithographic methods. The gate stack 314 serves as a further mask for the channel 322 portion of the substrate 300. A first ion implantation is illustrated by the arrows in FIG. 3a. This first ion implantation is of a p-type dopant to create a p-type pocket for an n-type drain. In the alternate embodiment the dopant is boron (B +11), and it is implanted at an implant angle of approximately zero degrees (~0°). It is understood that a tilt implant may also be used.

Figure 3B:
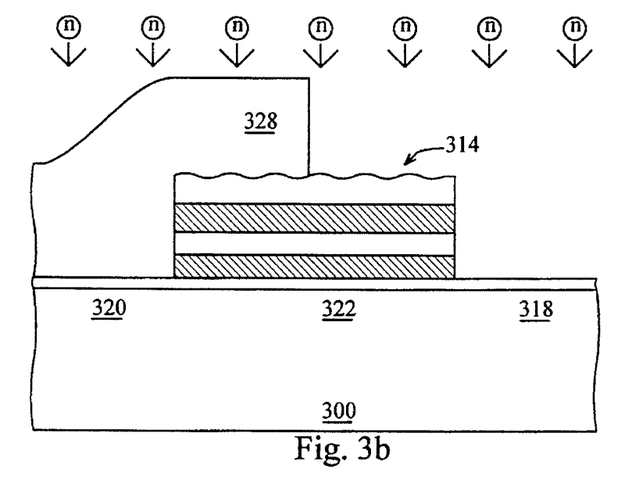

Following the p-type pocket implant, an n-type drain ion implantation is performed, as shown in FIG. 3b. Using the same drain implant mask 328 carried over from the p-type pocket implant, n-type dopants are implanted into the drain region 318. In the alternate embodiment, the n-type dopant is arsenic (As +75), and, like the p-type pocket implant, it is implanted at approximately zero degrees (~0°). Once the p-type pocket and n-type drain implants have been performed, the drain implant 328 mask is stripped.

Figure 3C:
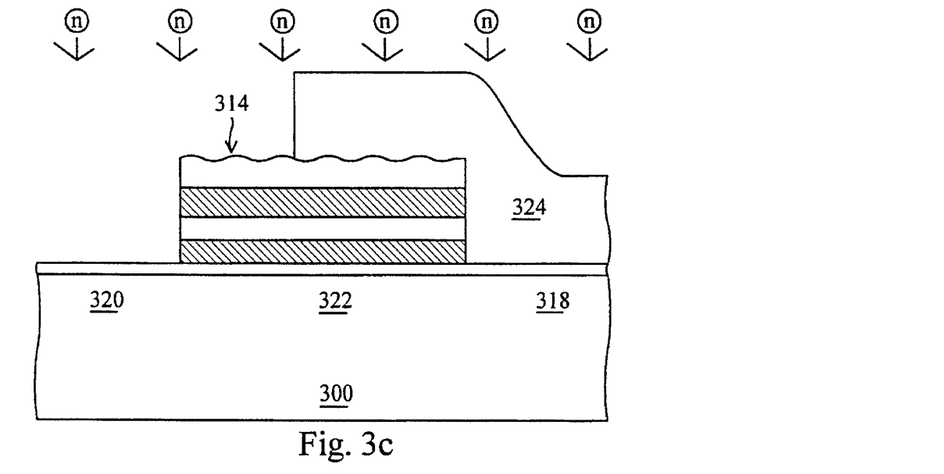

FIG. 3c discloses the source implant process steps of the alternate embodiment set forth in FIGS. 3a–3e. For the source implant, a source implant mask 324 is used. Like the source implant mask 124 illustrated in the embodiment of FIG. 2h, the source implant mask 324 of the alternate embodiment masks the drain portion 318 and leaves the source portion 320 exposed. The source portion 320 is given a first source ion implant of a first n-type source dopant. For the alternate embodiment the first n-type source dopant is selected to be phosphorous (P +31). The implant angle, as represented by the directional arrows in FIG. 3c, is shown to be approximately zero degrees (~0°).

Figure 3D:
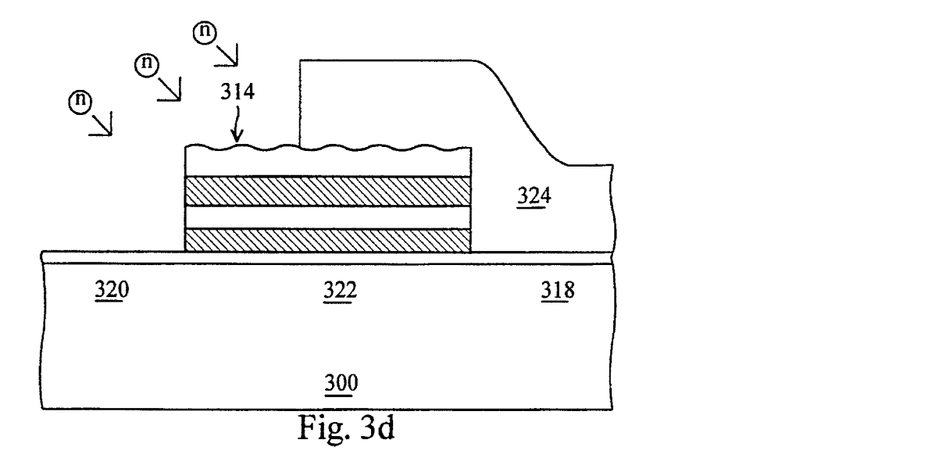

FIG. 3d illustrates a second and last source implant step for the alternate embodiment. The second source implant uses the same source implant mask 324 which is carried over from the previous step set forth in FIG. 3c. Like the implant step of the embodiment set forth in FIG. 2h, the implant of the alternate embodiment is a large angle tilt implant. The tilt angle is an acute one when taken with respect to the source region 320 side of the gate stack 314. The second source implant step results in a significant number of second n-type dopants being implanted within the source region 320 below the floating gate 306 of the gate stack 314. The second source dopant is selected to be arsenic (As +75). Following the second source implantation the source implant mask 324 is stripped.

The implantation energies and doses of the first source implant and second source implant are selected to create a "double-diffused" source configuration, with the phosphorous creating an outer source region of lower concentration that surrounds an inner source region of higher concentration.

Figure 3E:
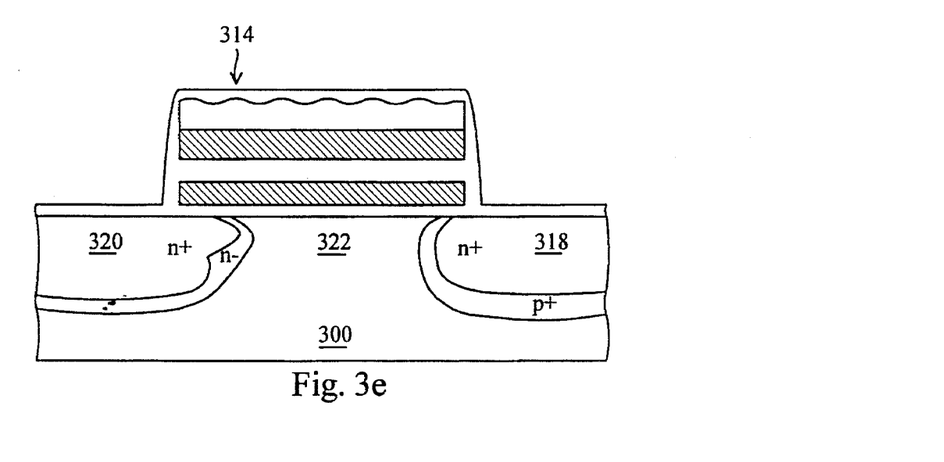

Referring now to FIG. 3e, a cross sectional view of the alternate embodiment following a heat treatment/oxidation step is illustrated. As set forth in figure, all the implanted dopants have been activated and diffused. The resulting structure includes a p-type pocket that surrounds the n+ diffusion of the drain region 318. The source region 320 is double diffused, but as fancifully represented in figure, includes a increased concentration at the interface of the floating gate 306 and the n+ portion of the source region 320. Again, it is understood that the views set forth in FIGS. 3a–3e are illustrative only, having exaggerated dimensions to assist in understanding the present invention.

One skilled in the art would recognize that the large angle tilt ion implantation performed on the source region, as set forth in the above embodiments, could also be used in the formation of a drain region, if that drain region were to be used for flash erase (as opposed to the source).

All of the above are only some of the examples of the available embodiments of the present invention. Those skilled in the art would recognize that numerous modifications and alternations may be made without departing from the spirit and scope of the invention. Accordingly, the above disclosure is not intended to be limiting and the appended claims are to be interpreted as encompassing the entire scope of the invention.

INDUSTRIAL APPLICABILITY

While the predominant intended usage of the present invention is intended for flash EPROM memories and programmable logic devices using flash technology, the invention may be used in any application wherein charge is transferred from a floating gate structure to a doped substrate using Fowler-Nordheim tunneling. The main area of improvement is an increased erase speed for a flash EPROM cell.

Since the improved flash EPROM cell of the present invention may be readily implemented with existing processes, it is expected that it will be acceptable in the industry as an improved substitute for conventional flash EPROM cells. For these and other reasons, it is expected that the utility and industrial applicability of the invention will be both significant in scope and long-lasting in duration.

What I claim is:

1. A method of fabricating an electrically programmable read-only memory array having an improved erase time, the array having cells with floating gates that are erased by tunneling electrons from the floating gate to a source, the method comprising, the steps of:

(a) on a substrate of a first conductivity type, forming a tunnel dielectric;

(b) forming at least one floating gate over said tunnel dielectric, each said floating gate having a first side and an opposing second side, a portion of the substrate adjacent to the first side being a source portion, and a portion of the substrate adjacent to the second side being a drain portion, the portion of the substrate intermediate the source and drain portions being a channel;

(c) forming an intergate dielectric over each said floating gate;

(d) forming a control gate on each intergate dielectric, the control gate being disposed over the respective floating gate of the intergate dielectric, each combination of floating gate, intergate dielectric, and control gate being a gate stack;

(e) masking the drain portion with a drain mask;

(f) doping the source portion by ion implantation at a tilt angle with a first dopant of a second conductivity type, the tilt angle being such that the first dopant is implanted into the source portion of the substrate, including a portion underneath the first side of the floating gate; and (g) subsequently doping the source and the drain regions with a second dopant of the second conductivity type by at least a second ion implantation, thereby forming source and drain regions having asymmetrical concentration profiles of the second conductivity type dopants.

2. The method of claim 1 wherein:

the first dopant of step (f) is arsenic.

3. The method of claim 1 wherein:

step (g) further includes
    removing the drain mask, and
    simultaneously doping the source portion and the drain portion with the second ion implantation to create a double diffused source structure, the second ion implantation being at a substantially vertical angle with respect to the substrate.

4. The method of claim 3 wherein:

the second dopant is phosphorous.

5. The method of claim 1 wherein:

step (g) further includes doping the drain portion with a third dopant of the first conductivity type to create a drain portion having a pocket of the first conductivity type dopant surrounding the second dopant of the second conductivity type.

6. The method of claim 5 wherein:

the third drain dopant is boron, the second drain dopant is arsenic.

7. The method of claim 5 wherein:

step (e) further includes forming a source mask prior to implanting the second and third drain dopants, the source mask covering the source portion and leaving the drain portion exposed.

8. The method of claim 3 wherein:

the second source dopant is arsenic.

9. The method of claim 1 further including:

step (h) following step (g), step (h) including thermally treating the substrate to activate the implanted ions.

10. In a method of fabricating a semiconductor device having a substrate doped with a dopant of a first conductivity type, a gate stack structure formed thereon, and source and drain regions of the second conductivity type formed within the substrate adjacent to the gate stack, the device utilizing tunneling to transfer electrons from a floating gate, through a tunnel insulator, to the source region, the improvement comprising:

masking the drain region with a drain mask;

using a first ion implantation step to form the source region, the first ion implantation being a large angle tilt ion implantation for implanting a first dopant of the second type into a portion of the substrate below an overlap portion of the floating gate;

removing the drain mask;

masking the source region with a source mask;

using a second ion implantation to form the drain region, the second ion implantation being at a substantially vertical angle with respect to the substrate; and annealing the substrate such that the first dopant diffuses to the surface of the substrate below the overlap portion of the floating gate.

11. The improvement of claim 10 wherein:

the floating gate is polysilicon.

12. The improvement of claim 10 wherein:

the substrate is p-type silicon and the doped portion is n-type silicon.

13. The improvement of claim 10 wherein:

the first dopant is arsenic.

* * * * *

UNITED STATES PATENT AND TRADEMARK OFFICE
CERTIFICATE OF CORRECTION

PATENT NO. : 5,518,942
DATED : May 21, 1996
INVENTOR(S) : Ritu Shrivastava

It is certified that error appears in the above-indentified patent and that said Letters Patent is hereby corrected as shown below:

column 1, line 44, after "arranged with common"

please delete [drain] and substitute -- source --.

Signed and Sealed this

Twenty-fourth Day of June, 1997

Attest:

BRUCE LEHMAN

*Attesting Officer*  *Commissioner of Patents and Trademarks*